United States Patent [19]

Tucker et al.

[11] Patent Number: 4,504,785

[45] Date of Patent: Mar. 12, 1985

[54] SAMPLING SPECTRUM ANALYZER

[75] Inventors: Trevor W. Tucker, Nepean; Larry J. Conway, Kanata, both of Canada

[73] Assignee: Her Majesty the Queen in right of Canada, as represented by the Minister of National Defence of Her Majesty's Canadian Government, Ottawa, Canada

[21] Appl. No.: 472,794

[22] Filed: Mar. 7, 1983

[30] Foreign Application Priority Data

Mar. 18, 1982 [CA] Canada .................................. 398750

[51] Int. Cl.³ .............................................. G01R 23/16
[52] U.S. Cl. ................................ 324/77 H; 324/77 B; 324/84; 328/56; 328/151
[58] Field of Search .................. 328/151, 56; 364/485; 333/258; 324/58 R, 58 A, 77 D, 77 E, 77 B, 77 H, 84, 95

[56] References Cited

U.S. PATENT DOCUMENTS 3,305,785  2/1967  Carroll ................... 328/56
4,305,159  10/1981 Stromswold ............. 324/77 B
4,359,690  11/1982 Tucker et al. ............. 328/151

Primary Examiner—Michael J. Tokar
Attorney, Agent, or Firm—Anthony T. Lane; Jeremiah G. Murray; Edward Goldberg

[57]  ABSTRACT

A sampling spectrum analyzer provides instantaneous continuous wideband spectrum analysis to allow RF signals occurring simultaneously and spaced within the band to be displayed. An input signal is split and each resulting portion is passed down a tapped delay line, with samples at the taps of each line being processed by separate arithmetic units. The output of each arithmetic unit is applied to the taps of output delay lines which are similar to the input delay lines. Each arithmetic unit weights the input samples with a set of coefficients and sums the resulting signal in a prescribed manner, thus transforming the signal into the frequency domain, according to a discrete Fourier transform. The resulting sums are the real and imaginary terms of a signal which are vectorially added, resulting in a signal which is fed to the ordinate of a display having a swept time base representing frequency.

10 Claims, 2 Drawing Figures

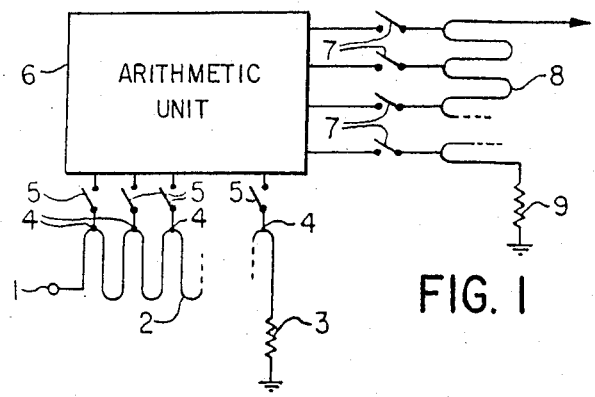
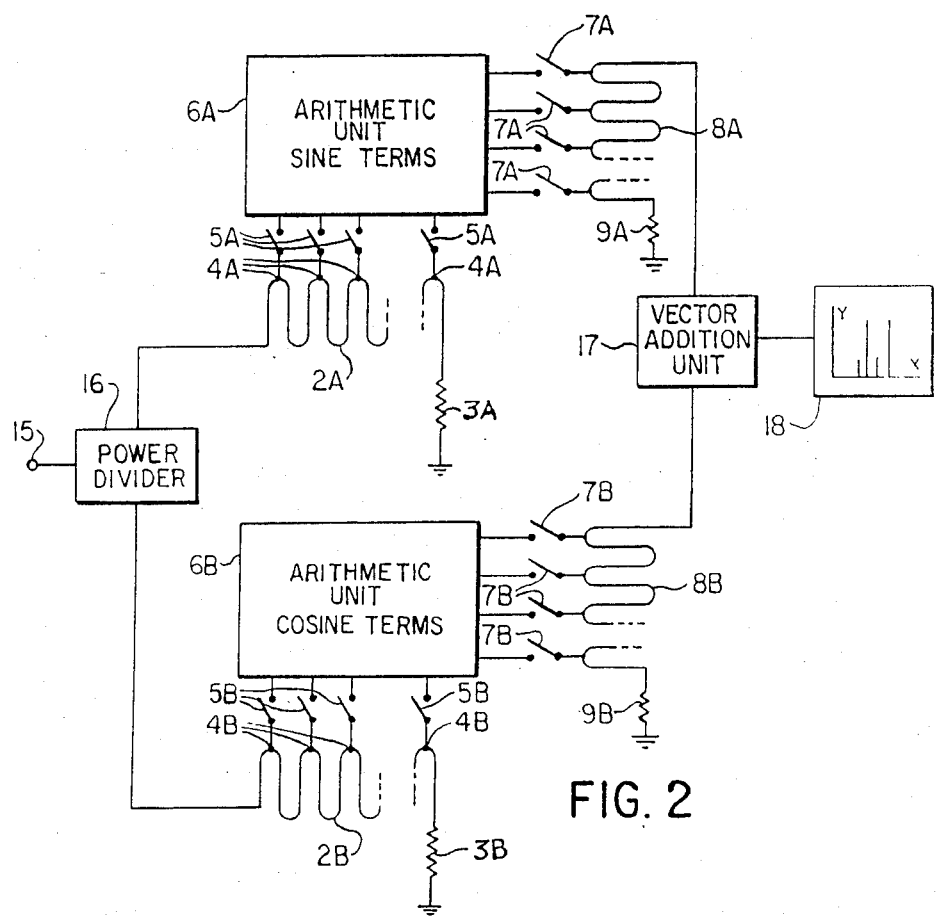

SAMPLING SPECTRUM ANALYZER

BACKGROUND OF THE INVENTION

1. Field of the Invention

This invention relates to the field of electronic signal processing, and more particularly to a spectrum analyzer for providing an indication of the presence of one or multiple simultaneous radio frequency signals which may be spaced over wide frequency bands.

2. Description of the Prior Art

The presence of radio frequency signals at particular frequencies can be very usefully displayed on a spectrum analyzer. A spectrum analyzer display provides a swept time base abscissa calibrated in frequency, and an ordinate calibrated in signal amplitude. Spectrum analyzers are usefully employed in the design of signal processing circuits, are used during signal identification procedures for tactical electronic support measures, counter measures and electronic intelligence collection, etc. A spectrum analyzer thus provides a useful visual insight into the content of radio frequency band.

The derivation of the signals to display, however, has been complex and difficult, and each derivation technique suffers from various problems.

For example, according to one prior art technique, a superheterodyne receiver includes a tunable bandpass filter which scans through a frequency range, with whatever signal appearing in the pass band at a particular instant in time being displayed. Consequently the swept superheterodyne receiver cannot consider all of the frequencies at every instant in time, and it cannot provide instantaneous wideband spectrum analysis.

In order to overcome this problem and provide instantaneous wideband spectrum analysis, channellized receivers have been used. These receivers employ banks of contiguous bandpass filters and fixed tuned local oscillators. The contiguous filters encompass the frequency band to be considered. After down-converting, the resulting intermediate frequency bands are again individually divided, and the intermediate frequency bands ae down-converted to baseband which is then divided by narrow passband filters. The signal output at the narrow baseband slots which, for example, may be 12.5 megahertz wide each, resulting from a typical 1 gigahertz radio frequency band, can be scanned sequentially and displayed.

Clearly the channellized receiver introduces complex technology and high cost. Potentially wide bandwidths are displayed only at the expense of high complexity. Further, many channellized receivers utilize time sharing techniques which limit multiple simultaneous signal capability. Receivers employing frequency multiplexing, or band multiplexing, may incur ambiguity problems in the case of time coincident radio frequency signals arriving from different radio frequency bands. In addition, signal splitting and combining tend to limit the sensitivity of the receiver. This system requires a great many filters each precisely tuned, which is very expensive. The complexity, size and power consumption of this form of system results in cost and reliability problems for most applications.

In another method of providing instantaneous spectral analysis, use is made of a phase-comparison instantaneous frequency measurement receiver technique. An input signal to the receiver is split into parallel radio frequency paths, with one path containing a delay line. The two paths feed a phase detector. The output signals of the phase detector are proportional to the radio frequency amplitude and the sine and cosine of the phase difference between the two phase detector input ports. The delay line length causes a phase angle between the two signals to be proportional to the radio frequency input frequency. Thus when a pulsed radio frequency input signal is applied, simultaneous video pulses proportional to the sine and cosine of the radio frequency signal are generated. The information contained within these signals is digitized and passed to a processor or computer for generating display signals.

The phase comparison instantaneous frequency measurement receiver technique is incapable of handling multiple simultaneous signals, even though the technique is more moderate in cost and complexity than the channellized receiver technique. Since the instantaneous frequency measurement receiver depends entirely on a frequency/transfer function to derive the frequency data, it is not possible for the receiver to respond to two radio frequency voltages simultaneously. Clearly the phase detector outputs cannot assume two voltage values simultaneously.

Thus if two or more radio frequency signals are received simultaneously, an entirely erroneous measurement can be obtained. This key disadvantage to the phase comparison instantaneous frequency measurement-technique results in its susceptibility to jamming.

Another method of achieving instantaneous spectral analysis over wide radio frequency bands is to use acousto-optical processing techniques. An input signal is down-converted to an intermediate frequency band, and then amplified. The amplified signal is applied to an acoustic transducer of an acousto-optical BRAGG cell. The travelling acoustic wave launched into the optically transparent acoustic medium of the BRAGG cell creates temporary local variations in the optical refractive index. A laser beam intercepts the acoustic wave and is diffracted by an angle which is proportional to the frequency of the acoustic wave. This defracted light is then passed through an optical waveguide lens which focuses the diffracted rays onto a detector array. Each element in the array corresponds to a different acoustic frequency (and therefore radio frequency).

The acousto-optical processing system has several problems. For example, its sensitivity is degraded with narrow pulse widths, and the technology is complex, involving BRAGG cells, lasers and optical array detectors. A principal limitation of this technology is that BRAGG cells presently possess a maximum instantaneous bandwidth of approximately 1 gigahertz, since microwave signals must be down-converted to below 1 gigahertz for processing. Down-conversion by heterodyning results in a present maximum radio frequency bandwidth of approximately 1 gigahertz.

SUMMARY OF THE INVENTION

The present invention is a spectrum analyzer which provides instantaneous spectral analysis of single or multiple simultaneous radio frequency signals which may be spread over wide radio frequency bands. For example, it is believed that bandwidths of at least 2.5 gigahertz can be sampled. Narrow pulse widths can be handled without degradation to its sensitivity. Its rugged construction with semiconductor devices also promotes its reliability and economical construction.

The present invention makes use of the distributed sampling concept described in U.S. Pat. No. 4,359,690, issued Nov. 16, 1982 and assigned to Her Majesty the Queen in Right of Canada as Represented by the Department of National Defense. A signal is passed down an input tapped delay line, signals at the taps being repetitively and simultaneously sampled. Each of the samples is translated via a discrete Fourier transform. The resulting signals are representative of the input RF signal, which when added together in time order, are representative of either the real or imaginary terms. Vector addition of the real and imaginary terms results in a succession of values each representative of the amplitude of a signal at successive freqencies in the radio frequency band.

More generally, the invention is a sample spectrum analyzer comprising apparatus for repetitively simultaneously sampling successive time spaced elements of an input signal, apparatus for transforming each sample according to either one of the transforms $$\sum_{n=0}^{N-1} fn \cos\left(\frac{2\pi mn}{NT}\right) \text{ or } \sum_{n=0}^{N-1} fn \sin\left(\frac{2\pi mn}{NT}\right)$$

where
m/NT is the frequency of the $m^{th}$ frequency component
m is 0, 1 ... N−1
fn is the $n^{th}$ sample of the input signal
T is the sampling interval between successive samples,
whereby a plurality of signals is obtained each representative of a different frequency component of the input signal.

The invention also includes apparatus for summing the plurality of signals in a predetermined time order. This results in a signal representative of either the real or imaginary terms of the input signal in the frequency domain.

These terms can then be summed and displayed as an ordinate (amplitude value) above a swept time base abscissa having intervals which are representative of frequency.

According to a more particular embodiment of the invention, the sampling spectrum analyzer is comprised of an input for receiving a pulse form of radio frequency input signal and a power splitter connected to the input for providing a pair of signals corresponding to the input signals. A pair of input delay lines are connected to the splitter, each for receiving one of the signals of the pair of signals. Each of the delay lines is tapped at similar time interval locations. A sampling circuit simultaneously samples the signals carried by the delay lines at the tap locations. An arithmetic unit transforms each of the signal samples from the delay lines according to the transform $$\sum_{n=0}^{N-1} fn \cos\left(\frac{2\pi mn}{NT}\right) \quad \text{(a)}$$

from one of the delay lines, and $$\sum_{n=0}^{N-1} fn \sin\left(\frac{2\pi mn}{NT}\right) \quad \text{(b)}$$

from the other of the delay lines, where m/NT is the frequency of the $m^{th}$ frequency component of the input signal
m is 0, 1, 2 ... (N−1)
fn is the $n^{th}$ sample of the input signal, and
T is the sampling interval between successive samples.

The samples transformed according to the transform (a) are applied to corresponding taps of a first output delay line, and the samples transformed according to the transform (b) are applied to corresponding taps of the other output delay line. A vector adder adds the output signals of the output delay lines to obtain a time ordered resultant signal representative of the amplitude of the input signal at successive frequencies. This resultant signal is applied to the ordinate input of a display having a swept abscissa, to provide a representative display of the amplitude of the input signal at successive input frequencies along the abscissa.

A better understanding of this invention will be obtained by a consideration of a detailed description below, with reference to the following drawings.

BRIEF DESCRIPTION OF THE DRAWINGS

FIG. 1 is a block schematic of the basic frequency transformation unit used in the present invention, and
FIG. 2 is a block schematic of a specific embodiment of the invention.

DESCRIPTION OF THE PREFERRED EMBODIMENT

As shown in FIG. 1, an input radio frequency signal of the bandwidth to be analyzed is applied to input terminal 1 of a tapped delay line 2, which is terminated by a load 3. The tapped delay line 2 is tapped at equal interval taps 4, the number of taps (0 to (N−1)) representing the number of frequency components to be sampled. Each of the taps is connected via sampling switches 5 to an arithmetic unit 6, which acts on the signals received from the taps in a manner to be described below.

There are an equal number of outputs of the arithmetic unit 6 as there are inputs. These are connected via sampling switches 7 to the taps of an output delay line 8, which is terminated by a load resistor 9. There are of course a similar number of taps in the output delay line as there are in the input delay line 2. The sampling switches close simultaneously and repetitively, as described in aforementioned U.S. Pat. No. 4,359,690.

The arithmetic unit transforms each of the samples of the signal passing down the input delay line 2 according to one of the transforms $$\sum_{n=1}^{N-1} fn \cos\left(\frac{2\pi mn}{NT}\right) \text{ or } \sum_{n=0}^{N-1} fn \sin\left(\frac{2\pi mn}{NT}\right)$$

in which
m/NT is the frequency of an $m^{th}$ frequency component of the input signal
m is 0, 1, 2 ... (N−1)
fn is the $n^{th}$ sample of the input signal, and
T is the sampling interval between successive samples.

The arithmetic unit thus transforms the input radio frequency signal into its frequency domain terms, either the real or the imaginary. The resulting transformed signals are sampled upon the simultaneous repetive closure of sampling switches 7 and are applied to the output delay line 8, in which they are added in time order. The transformed waveforms which are applied to the output delay line are representative of the discrete frequency values of the input signal.

The circuitry of the arithmetic construction, for example can consist of resistive divider networks to provide the sine and cosine weighting coefficients to carry out the weighting coefficient multiplication operation, and video amplifiers can provide the summing operation. This can be implemented on a multi-layer printed circuit board by a person skilled in the art.

Of course the greater the numbers of taps, the higher will be the resolution of the system.

A complete sampling frequency spectrum analyzer is shown in FIG. 2. FIG. 2 provides signals representative of both the real and imaginary terms of the input signal, and their vector addition.

A pulse form of radio frequency signal to be spectrum analyzed is applied to terminal 15, from which it is carried to a power divider 16. The two resulting equal output signals of the power divider representative of the input signals are applied to the inputs of similar tapped delay lines 2A and 2B, having similar interval tap locations 4A and 4B. Signals received thereat are passed via sampling switches 5A, in the case of tapped delay line 2A, and switches 5B, as in the case of tapped delay line 2B, to arithmetic units 6A and 6B respectively. Arithmetic unit 6A transforms each sample of the input signal from each tap 4A, providing the sine terms, according to the transform $$\sum_{n=0}^{N-1} fn \sin\left(\frac{2\pi mn}{NT}\right)$$

while arithmetic unit 6B transforms each sample of the input signal from each tap 4B, providing the cosine terms, according to the transform $$\sum_{n=0}^{N-1} fn \cos\left(\frac{2\pi mn}{NT}\right)$$

Thus individual elements of the real and imaginary terms of the input signal are provided at the outputs of the arithmetic units 6A and 6B respectively. The two arithmetic units of course operate in the same manner differing only in values of their weighting coefficients.

The output signals of arithmetic units 6A and 6B are coupled via sampling switches 7A and 7B respectively into output delay lines 8A and 8B respectively. Preferably these output delay lines are similar to the input delay lines and have similar numbers of taps and intervals between taps. Delay line 8A is terminated by load 9A and delay 8B is terminated by load 9B.

The transformed waveform samples applied to the taps of delay lines 8A and 8B travel down the meandering delay lines to individual inputs of a vector addition unit 17. This unit is also a well known component, and can be an analog multiplier circuit or a hybrid combiner which add the cosine and sine terms vectorially. For example, according to one implementation, the output 8B is fed through a hybrid network such as a 90° hybrid coupler available, for example, from Omni Spectra of Merrimack, N.H., to provide both a 0° and a 90° output component. The 0° output component is terminated into a load. The 90° output component is fed into one port of a 2-way combiner, also available from Omni Spectra. The 8A side is fed to a delay line to compensate for the delay through the hybrid network. Also provided is an attenuator component to attenuate the A side to compensate for the hybrid unit. This signal is fed to the other port of the 2-way combiner. The output of the 2-way combiner gives the output of the vector addition unit.

The output signal of the vector addition unit 17 is a signal representative of the amplitude of the input signal with frequency, the frequency being a function of time. Thus the signal can be applied to the ordinate of a swept display 18 such as an oscilloscope having a swept time base abscissa which is calibrated in frequency units across the bandwidth to be swept. The amplitude of the input signal across the band to be analyzed is thus displayed.

As an example of the operation of this circuit, in a system using 16 tap (sample) points along each of the input delay lines having 200 picosecond delays between successive taps, instantaneous spectral analysis over bandwidths of approximately 2.5 gigahertz with approximately 300 megahertz resolution in a single 3.2 nanosecond signal segment is achievable.

Thus a considerable advance over prior art systems is obtained, handling simultaneous multiple signals over extremely wide bandwidths. In addition, narrow pulse widths can be handled without degradation to its sensitivity. Due its simple design which can be fabricated using semiconductors, a highly reliable inexpensive device results.

A person skilled in the art understanding this invention may now conceive of other embodiment or variations in design. All such variations or other embodiments using the principles of this invention are considered to be within the sphere and scope of this invention as defined in the claims appended hereto.

What is claimed is:

1. A sampling spectrum analyzer comprising:
   (a) means supplying an input signal,
   (b) means for repetitively simultaneously sampling successive time spaced components of said input signal, and
   (c) means for transforming each sample according to one of the transforms $$\sum_{n=0}^{N-1} fn \cos\left(\frac{2\pi mn}{NT}\right) \text{ and } \sum_{n=0}^{N-1} fn \sin\left(\frac{2\pi mn}{NT}\right)$$

in which m/NT is the frequency of the $m^{th}$ frequency component, m is 0, 1 ... N−1, fn is the $n^{th}$ sample of the input signal, and T is the sampling interval between successive samples, to obtain a plurality of signals each representative of a different frequency component of the input signal.

2. A sampling spectrum analyzer comprising:
   (a) a delay line tapped at a plurality of terminals for carrying an input signal,
   (b) means supplying an input signal to said delay line,
   (c) means for repetitively sampling the input signal at said terminals, and (d) means for transforming the samples of the input signal from each tap terminal according to one of the transforms $$\sum_{n=1}^{N-1} fn \cos\left(\frac{2\pi mn}{NT}\right) \text{ and } \sum_{n=0}^{N-1} fn \sin\left(\frac{2\pi mn}{NT}\right)$$

in which m/NT is the frequency of an $m^{th}$ frequency component of the input signal, m is 0, 1, 2 ... (N−1), fn is the $n^{th}$ sample of the input signal, and T is the sampling interval between successive samples, to obtain a corresponding plurality of signals each representative of a different frequency component of the input signal.

3. The sampling spectrum analyzer as defined in claim 2 further including an output delay line tapped at a plurality of terminals each associated with a respective one of said plurality of signals, means for applying each of said plurality of signals to said associated terminals of the output delay line and means for receiving a combined signal from the output tapped delay line including said plurality of signals in order of occurrence.

4. The sampling spectrum analyzer as defined in claim 3 further including means for summing said plurality of signals in a predetermined time order to provide a plurality of different frequency components within a band of frequencies.

5. A sampling spectrum analyzer comprising:
(a) means supplying an input signal,
(b) means for repetitively simultaneously sampling successive time spaced components of said input signal,
(c) means for transforming each sample according to both the transforms $$\sum_{n=0}^{N-1} fn \cos\left(\frac{2\pi mn}{NT}\right) \text{ and } \sum_{n=0}^{N-1} fn \sin\left(\frac{2\pi mn}{NT}\right)$$

in which m/NT is the frequency of the $m^{th}$ frequency component, m is 0, 1 ... N−1, fn is the $n^{th}$ sample of the input signal, T is the sampling interval between successive samples, to obtain a plurality of first signals corresponding to one of said transforms each representative of a different frequency component of the input signal, and a plurality of second signals corresponding to the other said transform each representative of a different frequency component of the input signal, (d) means for summing the plurality of first signals in predetermined time order to obtain a first summed signal, (e) means for summing the plurality of second signals in predetermined time order to obtain a second summed signal, the second summed signal being orthogonal in the frequency domain to the first summed signal, and (f) means for vector adding the first and second summed signals, to obtain an output signal providing a time ordered signal representative of the amplitude of the input signal with respect to frequency within a band of frequencies.

6. A sampling spectrum analyzer comprising:
(a) signal input means for receiving RF signal input pulses,
(b) a power divider connected to the input means for providing a pair of signals corresponding to the input signal,
(c) a pair of delay lines connected to said power divider to receive respective signals, each delay line having a plurality of taps spaced at like time interval locations,
(d) means for simultaneously and repetitively sampling the pair of signals carried by the delay lines,
(e) means for weighting each of said input signal samples and summing the resultant signal in a predetermined time sequence to transform the resultant signal into a cosine function of frequency in accordance with a discrete Fourier transform relationship from one of the delay lines and into a sine function of frequency in accordance with said Fourier transform relationship from the other of the delay lines,
(f) a pair of output delay lines tapped at like predetermined time interval locations,
(g) means for applying the samples transformed according to said cosine function of frequency to corresponding taps of one of the output delay lines,
(h) means for applying the samples transformed according to said sine function of frequency to corresponding taps of the other of the delay lines, and
(i) means for vectorially adding output signals of the output delay lines to obtain a time ordered signal representative of the amplitudes of the input signal at successive frequencies within a band of frequencies.

7. The sampling spectrum analyzer as defined in claim 6 in which the output delay lines have like delays and delay intervals between taps as the input delay lines.

8. The sampling spectrum analyzer as defined in claim 6 further including display means connected to said means for vectorially adding output signals for receiving said time ordered signals on an ordinate input of a swept display for simultaneously displaying said amplitudes along a swept time base abscissa representative of frequency.

9. The sampling spectrum analyzer as defined in claim 6 wherein said Fourier transforms are $$\sum_{n=0}^{N-1} fn \sin\left(\frac{2\pi mn}{NT}\right) \text{ and } \sum_{n=0}^{N-1} fn \cos\left(\frac{2\pi mn}{NT}\right)$$

where m/NT is the frequency of the $m^{th}$ frequency component of the input signal, m is 0, 1, 2 ... (N−1), fn is the $n^{th}$ sample of the input signal, and T is the sampling interval between successive samples.

10. The sampling spectrum analyzer of claim 9 where said means for weighting and summing said signal is an arithmetic unit, said means for sampling includes first switching means connected between said plurality of taps and said arithmetic unit, and said means for applying the samples to taps of said output delay lines includes second switching means connected between said arithmetic unit and said output delay line taps.

* * * * *